United States Patent [19]

Ratnakumar

[11] Patent Number: 5,011,784
[45] Date of Patent: Apr. 30, 1991

[54] METHOD OF MAKING A COMPLEMENTARY BICMOS PROCESS WITH ISOLATED VERTICAL PNP TRANSISTORS

[75] Inventor: Kola N. Ratnakumar, San Jose, Calif.

[73] Assignee: Exar Corporation, San Jose, Calif.

[21] Appl. No.: 556,231

[22] Filed: Jul. 20, 1990

Related U.S. Application Data

[62] Division of Ser. No. 146,934, Jan. 21, 1988.

[51] Int. Cl.[5] .......................................... H01L 21/265
[52] U.S. Cl. ..................................... 437/34; 437/56; 437/31; 437/57; 437/59; 437/54; 357/44; 357/43; 148/DIG. 9
[58] Field of Search .................. 437/34, 56, 31, 57, 437/59, 54; 357/44, 43; 148/DIG. 9

[56] References Cited

U.S. PATENT DOCUMENTS

| | | | |
|---|---|---|---|
| 4,239,558 | 12/1980 | Morishita et al. | 437/31 |
| 4,529,456 | 7/1985 | Anzai et al. | 437/57 |
| 4,667,393 | 5/1987 | Ferla et al. | 437/54 |
| 4,855,244 | 8/1989 | Hutter et al. | 437/34 |
| 4,892,836 | 1/1990 | Andreini et al. | 437/34 |
| 4,918,026 | 4/1990 | Kosiak et al. | 437/34 |
| 4,939,099 | 7/1990 | Seacrist et al. | 357/43 |
| 4,954,456 | 9/1990 | Kim et al. | 437/31 |

OTHER PUBLICATIONS

Wolf, Stanley, *Silicon Processing for the VLSI Era*, vol. 2: Process Integration Lottice Press, Sunset Beach, CA (1990), pp. 523-553.

*Primary Examiner*—Brian E. Hearn
*Assistant Examiner*—Gordon V. Hugo
*Attorney, Agent, or Firm*—Townsend and Townsend

[57] ABSTRACT

A BiCMOS process which provides both isolated and vertical NPN and PNP transistors with better performance characteristics and fewer additional steps than the prior art. The additional steps consist of masked implants with no changes in the thermal steps of the CMOS process. An N-well to contain the vertical PNP transistor is formed during the same step that the NPN vertical transistor collector is formed. The N base of the PNP transistor is formed by implanting an N type material. A P type material is implanted at a high energy of at least 300 keV (150 for doubly ionized Boron) to form a collector of the PNP transistor. A P region is then formed as an emitter of PNP transistor. The high energy P implant gives a peak at approximately 0.8 μm below the surface to form the equivalent of a buried layer (without growing an epitaxial layer after a P implant to form a buried layer as in the prior art). The advantages of a sharp profile of the high energy P implant are maintained by performing this step near the end of the process to prevent the profile from being flattened by subsequent thermal steps. A flat base structure improves the devices' performance and is preferably provided by doing the N base implantation early in the process and allowing the temperature of later steps to drive the implanted ions deeper to provide a flat profile.

10 Claims, 7 Drawing Sheets

FIG._IIA. PRIOR ART

FIG._IIB.

METHOD OF MAKING A COMPLEMENTARY BICMOS PROCESS WITH ISOLATED VERTICAL PNP TRANSISTORS

This is a division of application Ser. No. 146,934, filed Jan. 21, 1988.

BACKGROUND

The present invention relates to a process for forming, on a single wafer, p- and n- channel MOS transistors along with vertical, isolated NPN and PNP transistors.

Currently CMOS is the dominant IC technology. It combines a high density of transistors with low power dissipation and high yield (due to its low sensitivity to semiconductor crystal defects.) Bipolar transistors, on the other hand, are faster with larger current drive, but consume more power and have lower VLSI yield. Integration of isolated vertical NPN transistors into a CMOS process results in faster bipolar performance. By retaining the majority of the transistors in CMOS, the low power and high yield of a CMOS process are maintained.

In analog circuits, isolated NPN transistors increase the bandwidth of Opamps five-fold compared to pure CMOS implementation. They also help in easier realization of bandgap voltage references. The addition of isolated, vertical PNP transistors to the NPN's constitutes the Complementary BiCMOS process. The bandwidths of Opamps is now increased by an additional factor of at least two. Circuit noise and settling time are less. Bias generators are easily realized. It also achieves rail-to-rail analog output with low distortion combined with capability to source or sink high currents.

It is more difficult to integrate isolated vertical PNP transistors into a CMOS process (non-isolated PNP transistors are connected to the P substrate or a P epitaxial layer and are more easily implemented).

The formation of a vertical PNP transistor and a CMOS process without using a buried P+ layer is suggested by Sullivan in U.S. Pat. No. 4,507,847. However, Sullivan does not provide details on how this could be accomplished.

A structure which can provide non-isolated vertical PNP transistors in a CMOS process is discussed in Y. Okada, et al., "An Advanced Bipolar-MOS-i$^2$l Technology With a Thin Epitaxial Layer for Analog-Digital VLSI", IEEE Transactions on Electron Devices, Vol. Ed.-32, No. 2, February 1985, pp. 232-236.

The following is a list of Complementary Bipolar Processes with isolated Vertical PNP's:

I. P. C. Davis, J. F. Graczyk and W. A. Griffin, "High Slew Rate Monolithic Operational Amplifier Using Compatible Complementary PNP's", IEEE J. Solid-State Circuits, Vol. SC-14, Vol.2, February 1979.

II. T. Kekkawa, T. Suganuma, K. Tanaka and T. Hara, "A New Complementary Transistor Structure for Analog Integrated Circuits", Int'l Solid State Circuits Conf. Tech Digest, 1980 p. 65-68.

III. D. Monttcelli, J. Wright, B. Small and B. Geczy, "200 MHz PNP Transistors Spawn Fast Analog Chips", Electronic Design, August 1986, p. 111-116.

IV. "First ADI CB Process Part is High Speed 12-Bit DAC Electronic Engineering Times". Monday, Sept. 7, 1987.

The vertical PNP transistors in the above references are formed through a buried P+ collector which is created by a P+ implant before the growing of an N epitaxial layer.

A BiCMOS process with lateral NPN and PNP transistors is shown in U.S. Pat. No. 4,050,965.

A number of references disclose the formation of vertial NPN transistors only, with no PNP transistors, such as U.S. Pat. Nos. 4,547,791; 4,536,945; 4,346,512; 4,016,596; and 4,299,024.

SUMMARY OF THE INVENTION

The present invention is an improved BiCMOS process which provides both isolated and vertical NPN and PNP transistors with better performance characteristics and fewer additional steps than the prior art. An N-well to contain the vertical PNP transistor is formed during the same step that the NPN vertical transistor collector is formed. The N base of the PNP transistor is formed by implanting an N type material. A P type material is implanted at a high energy of at least 360 keV to form a collector of the PNP transistor. A P region is then formed as an emitter of PNP transistor.

The high energy P implant gives a peak at approximately 0.8 um below the surface to form the equivalent of a buried layer (without growing an epitaxial layer after a P implant to form a buried layer as in the prior art). The advantages of a sharp profile of the high energy P implant are maintained by performing this step near the end of the process to prevent the profile from being flattened by subsequent thermal steps.

A flat base profile improves the devices' performance and is preferably provided by doing the N base implantation earlY in the process and allowing the temperature of later steps to drive the implanted ions deeper to provide a flat profile.

The complementary BiCMOS process of the present invention is one which integrates complementary, isolated vertical PNP and NPN bipolar transistors with complementary MOS transistors on the same silicon chip. Both the vertical NPN and PNP transistors have a high transition frequency (fT)>1 GHz). Also, both of them have excellent current drive capabilities of the order of 1 mA/100 um$^2$ (even without the addition of an N+ buried layer for the NPN's.) Thus, the process combines the high speed, excellent linearity and large bandwidth of complementary bipolar circuits with the high packing density and low power consumption of complementary MOS transistor circuits. It also results in a lower settling time for switching, and lower noise compared to either CMOS or BiCMOS with NPN transistors only. Also, the complementary bipolar transistors permit nearly rail-to-rail swings for linear signals with low distortion.

The complementary BiCMOS process of the present invention adds three additional non-critical masks and implants to an existing 11 mask, double poly, single metal, N-well CMOS process. Thus, it is a 14 mask process. However, there are no additional process steps except for the three masked implants listed below:
1. P-Base Implant Mask (For the base of Vertical NPN)
2. N-Base Implant Mask (For the base of Vertical PNP)
3. P-Collector Implant Mask (For the collector of Vertical PNP, could be combined with step 1)

For a fuller understanding of the nature and advantages of the invention, reference should be made to the ensuing description taken in conjunction with the accompanying drawings.

DETAILED DESCRIPTION OF THE PREFERRED EMBODIMENTS

The BiCOMOS process of the present invention, showing the new steps, is set forth in the Appendix.

Figure 1:
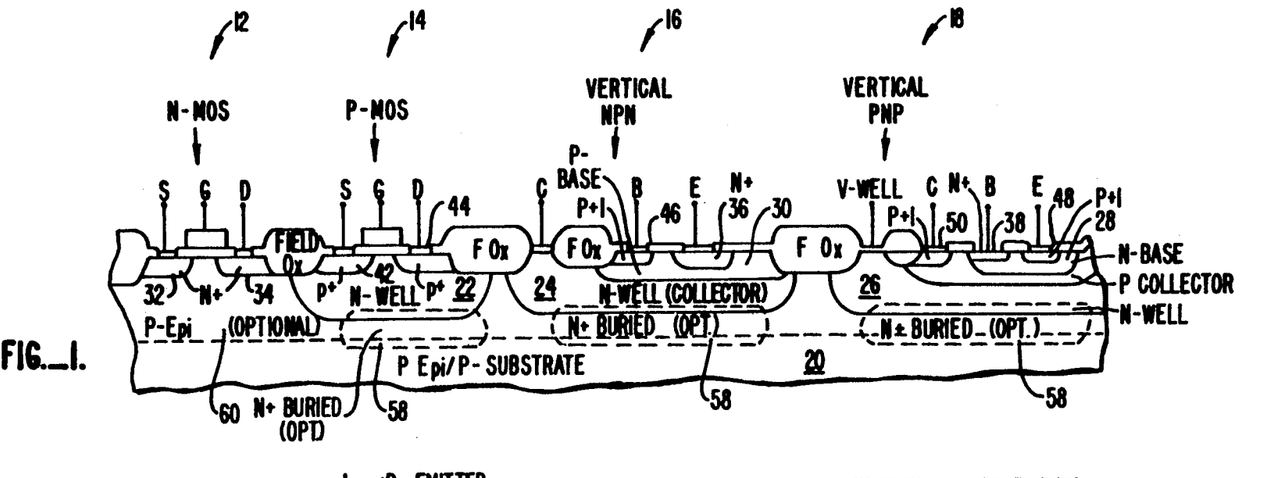
FIG. 1 is a cross-sectional diagram showing the N and P channel MOS transistors and the vertical isolated NPN and PNP transistors according to the present invention.

FIG. 1 generally shows the structure resulting from the process of the present invention. In addition to an N-MOS transistor 12, a P-MOS transistor 14 and a vertical NPN transistor 16 (which have been produced in the prior art), the present invention also produces a vertical PNP transistor 18. A P substrate or P epitaxial layer 20 is first provided, and 3 N-wells 22, 24 and 26 are produced in step M #1 (see Appendix). N-Base 28 of PNP transistor 18 is then produced, followed by the implantation of the P-Base 30 for NPN transistor 16. The N+ source 32 and drain 34 of N-MOS transistor 12 are then produced, along with N+ emitter 36 of NPN transistor 16 and N+Base contact 38 of PNP transistor 18. The high energy implantation to produce P collector 40 is then done. This is followed by the P+ diffusion for source 42 and drain 44 of P-MOS transistor 14, base contact 46 of NPN transistor 16 and emitter 48 and collector connection 50 of PNP transistor 18. The field oxide, metalization and other steps, are produced in a standard manner as set forth in the Appendix.

Figure 2A:
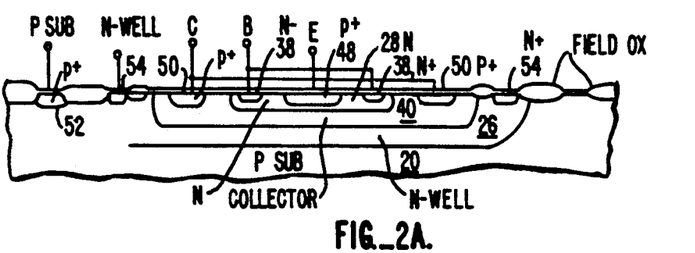
FIGS. 2A and 2B are cross-sectional and layout views, respectively, of a PNP transistor of FIG. 1.
Figure 2B:
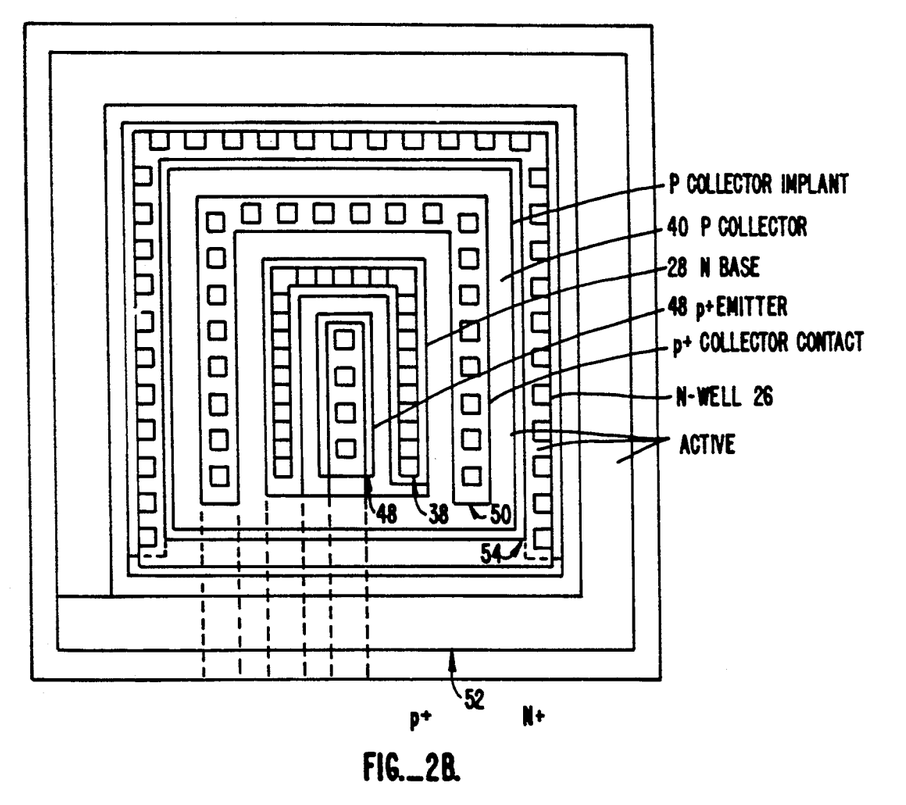

The preferred structure of PNP transistor 18 is shown in FIGS. 2A and 2B in cross-sectional and top views, respectively. The numbering corresponds to that of FIG. 1. Also shown is an additional P+ region 52 for coupling to the P substrate 20 and an N+ region 54 for coupling to N well 26.

Figure 3A:
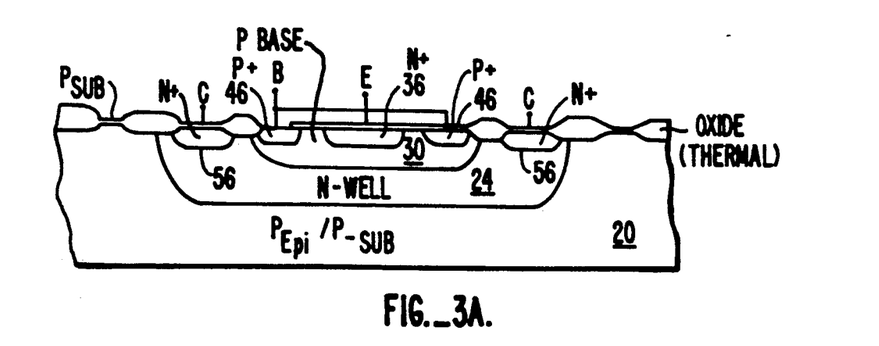
FIGS. 3A and 3B are cross-sectional and layout views, respectively, of the vertical NPN transistor of FIG. 1.
Figure 3B:
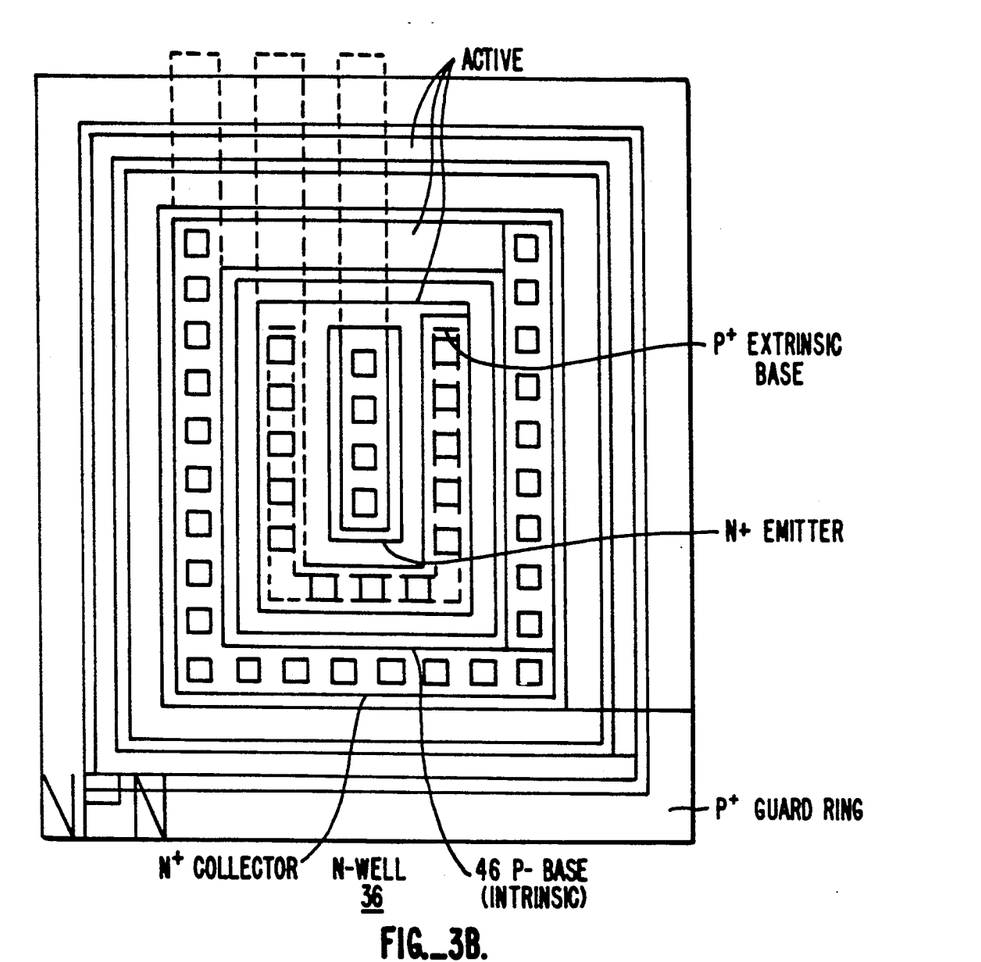

FIGS. 3A and 3B show a preferred embodiment of NPN transistor 16 of FIG. 1 with cross-sectional and top views, respectively. The numbering is the same as set forth in FIG. 1. In addition, an N+ collector contact 56 is shown.

A high fT vertical PNP transistor is unique to this BiCMOS process. Details of fabrication of this device are now described. The usual implementation of high performance vertical PNP transistors involves complex process steps which reduce yield, such as double epitaxy, etc. A feature of the process described here is that it involves three (or two) additional masked implant steps only, i.e., an N-Base implant mask and a P-Collector implant mask. This gives two advantages:

A. Principal device parameters such as current gain HFE, BVCEO and collector resistance can be easily adjusted by optimizing the dose and energy of these two or three implants.

B. Besides the masks and implants, there are no additional thermal/deposition/etching steps.

This yields:

(i) The same characteristics and SPICE model parameters for P and N channel MOS transistors and vertical NPN transistors with or without the PNP transistors. The circuit performance of these devices remains unchanged.

(ii) The yield is not affected since the masking steps are non-critical.

Each of these implant steps and its optimization are now described.

The P+ and N+ source/drain implants for the CMOS transistors form the P+ and N+ emitters of the PNP and NPN transistors, respectively. The N-well forms the collector of the NPN transistor and serves to isolate the P-collector of the PNP from the P-substrate or P-Epi on P-substrate. The N-well can merge with a N+ buried layer for higher NPN drive capability through a N+ buried layer implant and drive into a P-substrate and a subsequent P-Epi.

The P-Base Implant for the NPN and P-Collector Implant of the PNP can be combined to eliminate one additional mask and implant reducing it to a 13 mask process. Therefore only the additional N-Base and P-Collector masked implant steps are explained here. The rest of the steps are same as in a conventional CMOS process.

N-Base Implant

Simulations have been done for the optimum location of the N-Base Phosphorus implant in the process sequence. It is introduced early in the process, i.e., after the N-well drive and just prior to growing the gate oxide of the CMOS transistors. Thus, the N-Base is driven deep by subsequent thermal steps. If necessary, the drive can be increased without affecting the threshold adjust implants of the CMOS transistors, since these are implanted after the gate oxide. This deep drive gives a relatively flat implanted N-base impurity profile, leading to greater control and less sensitivity to process variations, compared to a much steeper N-base profile if this implant were to be done later. In order to have a reasonable Emitter-Base breakdown voltage (BVEBO), the surface concentration of the implanted phosphorus must be less than 3E18/cc which corresponds to a typical dose of from 3E13 to 1.5E14/sq.cm.

The N-Base implant dose and energy have a dominant influence on the following parameters:

1. The emitter-base reverse breakdown voltage (BVEBO) through the P+ Emitter N-Base junction at the surface;

2. The common emitter current gain HFE, which can be shown to be $$HFE = \frac{\gamma E}{\gamma B}$$

where $\gamma E$ and $\gamma E$ are the emitter and pinched base sheet resistance, respectively;

3. Collector resistance (RC) which is dominated by the pinched collector sheet resistance;

4. The emitter saturation current ($I_s$)
$I_s \propto QB$

5. VAF=Early Voltage $\propto 1/\gamma B$ 6. fT, which varies inversely with the square of base width.

Figure 4:
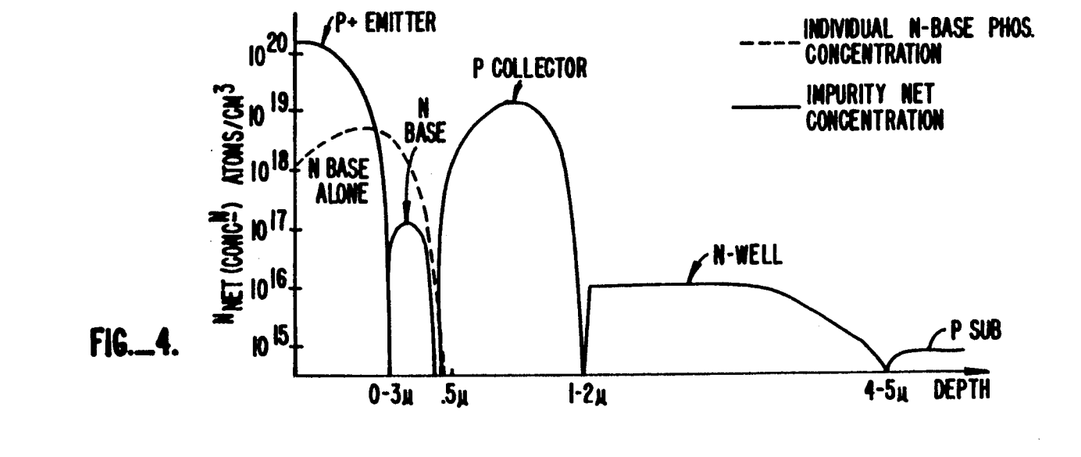
FIG. 4 is a graph of the impurity profile for an N-Base implant just before the emitter implant.
Figure 5:
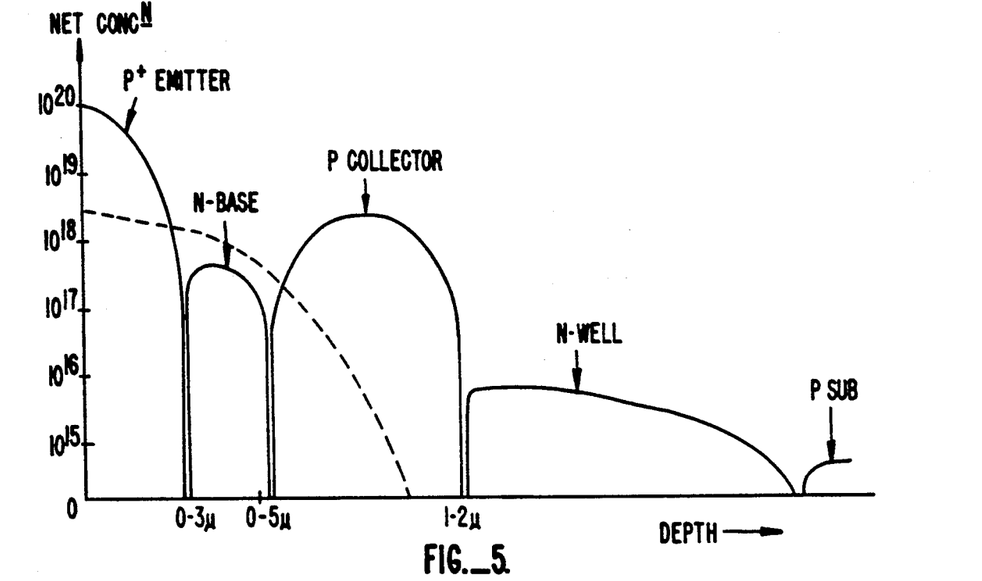
FIG. 5 is an impurity profile of a process in which the N-Base Mask follows immediately after the field implant.

The location of the N-Base implant in the process sequence is also of considerable importance. FIGS. 4 and 5 depict two hypothetical impurity profiles. The one in FIG. 4 corresponds to an N-Base implant just before the emitter implant, followed by minimum thermal steps. Consequently, both the emitter and base profiles are abrupt. If the P collector is also an implanted retrograde profile as illustrated, then there would be 3 abrupt impurity profiles. Any slight change in any of the three implant doses or energies would result in a major change in pinched base sheet resistance and would change all the device parameters listed above.

One other disadvantage of doing the N-Base implant just before the P+ S/D implant is the large difference between the individual implanted phosphorus profile and the much smaller net concentration in the N-Base region after compensation by Boron from the P collector and P+ emitter. This is because the implanted impurity peak lies inside the emitter even after a high energy phosphorus implant. Consequently, the peak phosphorus concentration is high (approximately $3-5 \times 10^{18}/cm^3$ and BVEBO is rather low. Therefore, an N-Base implant done just before BPSG densification and reflow (Appendix) has the demerits of large sensitivity to process fluctuations, low BVEBO and high emitter base junction capacitance.

The profile shown in FIG. 5 results from the process flow listed in the Appendix. In this one, the N-Base mask follows immediately after the Field implant. The implanted base is driven deep (to a depth of about 1.2 um at a concentration of $1 \times 10^{16}/cm^3$) due to subsequent high temperature steps such as gate oxide, interpoly oxidation at 1140° C. etc. Therefore, the base impurity profile is approximately constant or flat over the final N-Base region (0.25 t 0.45/um depth). Moreover, it is not sensitive to the BPSG flow and reflow conditions since the thermal Dt's associated with these steps are so much smaller compared to other high temperature steps such as interpoly ox., etc. Hence, a relatively stable individual base profile results. The typical base implant dose is in the range of $3 \times 10^{13}$ to $1 \times 10^{14}/cm^2$ with a surface concentration in the range of $5 \times 10^{17}$ to $2 \times 10^{18}/cm^3$. This corresponds to BVEBO in the range of 10 to 4V, which is quite adequate. In this scheme, the final net base charge is affected by compensation due to the P+ emitter profile diffusing down from the top surface and the P collector profile (a retrograde one achieved by a high energy Boron implant) "pinching" from below.

P-Collector

The way in which this implant is done is one factor that distinguishes this process and contributes to a successful implementation which gives a low collector-to-emitter punchthrough voltage. A low/medium energy Boron implant for this step would result in 4 implants diffusing into the P-substrate/P-Epi: 1. N-well, 2. P-Collector, 3. N-Base, and 4. P+ Emitter. This would result in a net collector concentration of the order of $1E16/cm^3$ and a depth of 1 um, resulting in an extremely high pinched collector resistance and severely limiting the current drive capability.

Instead, the P-collector is implanted at a very high energy (greater than 150 kV, preferably 180–200 kV Boron implant by using doubly ionized Boron or greater than 300 keV using singly ionized Boron). The resultant peak lies at a depth of about 0.8 um below the surface, forming a P+ buried collector well. The retrograde P-collector combines a low series resistance with a smaller collector-base junction capacitance due to reduced collector doping at the junction. To maintain this advantage, the profile must not be flattened by out-diffusion from subsequent thermal steps. Therefore, this implant is done just before the PSG/BPSG deposition and sees only the bare minimum thermal drive necessary for the doped oxide to flow. To keep the P+ emitter shallow so that the N-base width will not be too small, the masked P+ S/D implant is also done at this stage as shown in the Process Sequence Table (Appendix). For the same reason, this implant uses a Boron (BF2) species to give a shallower P+/N-base junction than would be given by a Boron implant at the same energy.

An implanter operating at 200 kV can accelerate the doubly ionized boron species to the same energy as 400 kV for singly ionized Boron. As a matter of practical detail the dose must be multiplied by a factor of 2 since each Boron ion has twice the charge.

Figure 6:
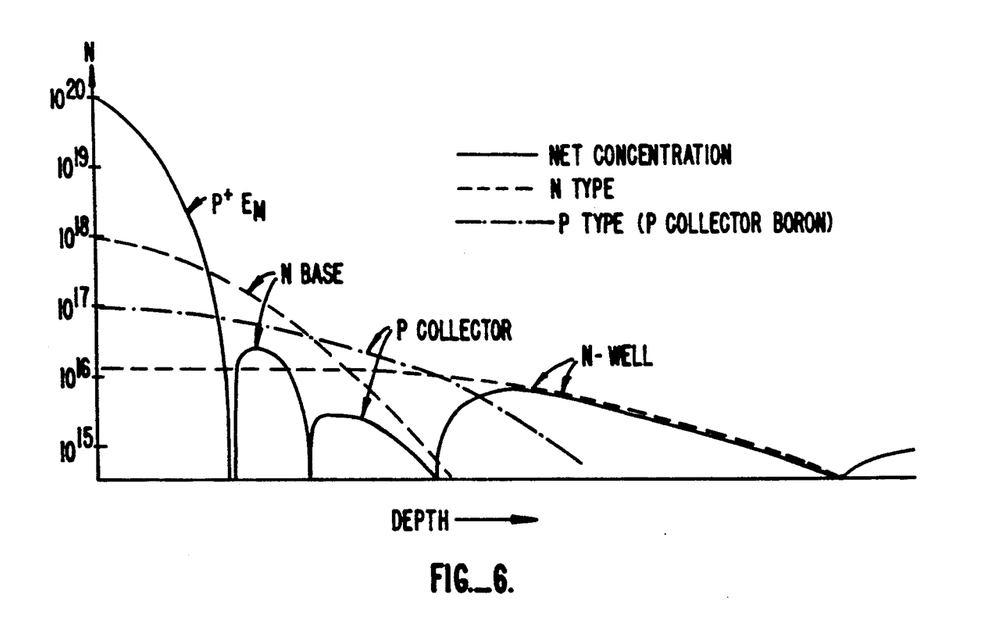
FIG. 6 is an impurity profile showing the P-Collector of a vertical PNP transistor which is driven down from the top surface.
Figure 7:
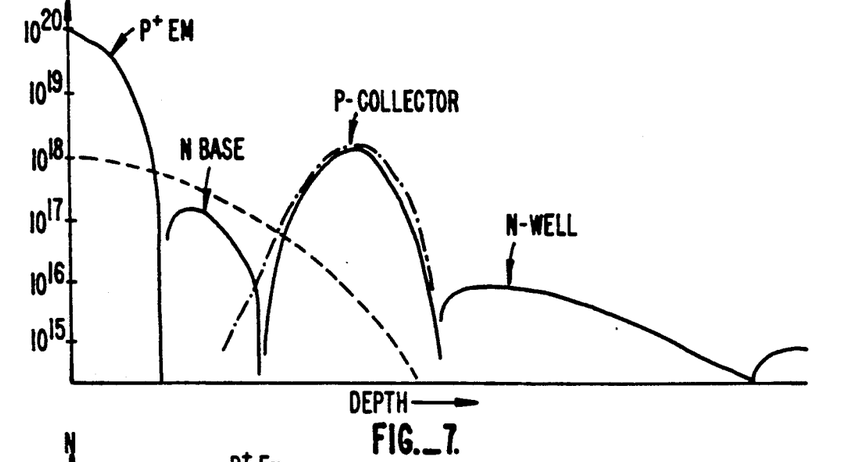
FIG. 7 shows an impurity profile resulting from a high energy Boron implant.

The need for this high energy retrograde P-Collector profile is obvious with reference to FIGS. 6 and 7. In FIG. 6 the individual and total (net) impurity profiles when the P-Collector is driven down from the top surface are shown. In this scheme there are 4 diffusions, P+ Emitter, N-Base, P-Collector and N-Well, resulting in complex compensations. The final base and collector charges are low. Since the P-Collector surface concentration has to be in between that of the N-Base (approx. $1 \times 10^{18}/cm^3$) and the N-Well ($1 \times 10^{16}/cm^3$), and its junction depth is also limited. Therefore, even the uncompensated collector charge is very small (approx. $1 \times 10^{13}$ atoms/cm$^2$). The pinched collector resistance is extremely high and severely limits the current drive capability of this device.

The retrograde profile for the P-Collector (FIG. 7) resulting from a high energy Boron implant (approx. 360–400 keV) is equivalent to a P+ buried collector. It yields the following desirable device characteristics:

1. Low collector series resistance. Notice that the collector peak concentration is about $10^{19}/cm^3$, about two orders of magnitude higher than the previous scheme (FIG. 6). Only a small fraction of this charge is lost due to compensation by the N-Base and N-Well implants. This in turn increases the current drive capability of this transistor.

2. The retrograde Boron profile for the collector increases the collector-base junction breakdown voltage while decreasing the capacitance of this junction.

The peak of the P-Collector lies at a depth of 0.7 to 0.8 um for an implant energy in the range of 380–400 keV and the P-Collector—N-well junction depth is about 1.2 um. The typical P-Collector implant dose is in the range of $2 \times 10^{13}/cm^{-2}$ to $2 \times 10^{14}/cm^{-2}$. The lower limit is set by the conditions that it must be larger than the N-well dose and by the condition that the pinched (buried) collector sheet resistance must not be too large in order to reduce the Ic*Rc voltage drop. If the P-Collector dose is increased, due to the standard deviation of the implant and diffusion during BPSG flow and reflow, it counter dopes the N-Base and increases the base sheet resistance. Eventually, punchthrough from collector to emitter occurs at a voltage less than that of the avalanche breakdown voltage of the collector-base junction. Finally, at a high enough collector dose, the P+ emitter and P-collector merge together with a small ohmic resistance.

The pinched collector sheet resistance varies from 1000 to 200 ohms/square. These are low enough that even a small geometry device can carry several milliamps of collector current before the C-B junction gets forward biased due to the IcRc drop.

P+ Emitter Implant

As pointed out earlier, the peak of the collector implant lies only at a depth of 0.7 um. Therefore, the N-Base/P-Collector junction depth must be less than 0.5 um.

Figure 8:
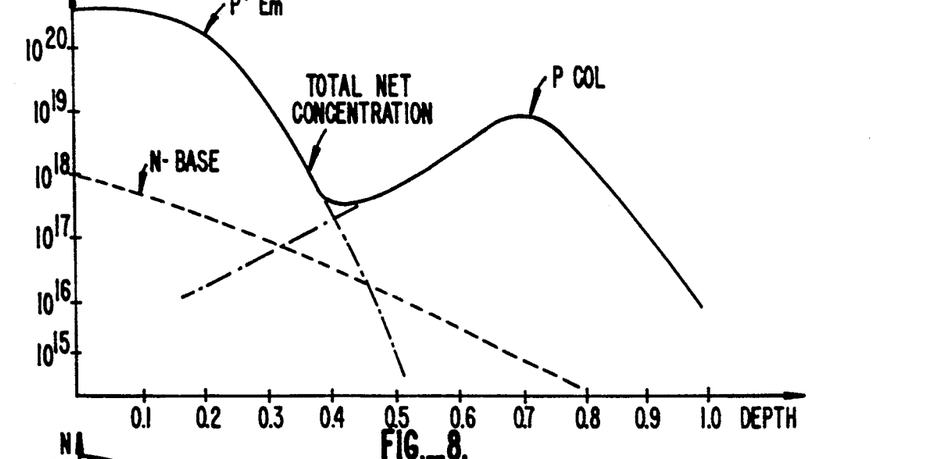
FIG. 8 is an impurity profile illustrating the merging of the P+ emitter with the P-Collector.

However, a $B^{11}$ Boron implant, even at a low energy 30 or 40 keV, has a large range and standard deviation so that the P+/N-Base junction depth is also approximately 0.5 um. Therefore, as illustrated in FIG. 8, the P+ emitter and P-Collector merge.

A P+ emitter implant using $BF_2$ at a low energy of from 40 to 60 keV is much shallower. This is because $BF_2$ dissociates into $B^{11}$ and $F_2$ on impact and the resultant $B^{11}$ has energy of only 11/49 times the energy of the $BF_2$ ion.

Figure 9:
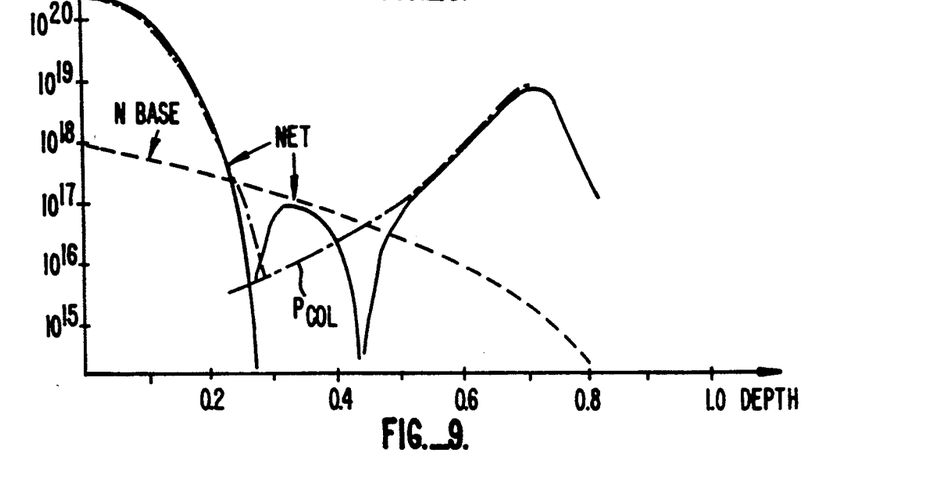
FIG. 9 is an impurity profile illustrating a shallow P+ emitter junction according to the present invention through a low energy $BF_2$ implant.

Thus, a $BF_2$ implant at 49 keV is equivalent to an 11 keV B'' implant. Both the range and the standard deviation are therefore proportionately smaller, resulting in a shallower P+ emitter junction (0.25 to 0.3 um). This as illustrated in FIG. 9, which shows the separation of the emitter from the P-Collector, allowing for an N-Base which is approximately 0–1 to 0–2 um wide. The P+ emitter $BF_2$ implant can also be replaced by a low energy Boron implant, i.e., $B^{11}$ at less than 15 keV.

There are two precautions to be observed in this process in order to avoid a base punchthrough:

1. In order for the low energy $BF_2$ implant to penetrate the oxide thickness, this implant screening oxide must be in the range of 100–300 angstroms.
2. To minimize the diffusions of the P+ emitter and the P collector, subsequent thermal steps should use minimum temperature and time.

For example, the BPSG flow (densification) and reflow times are cut in half compared to the standard times for this process. This is also the reason why the P collector and P+ emitter implant (Appendix) are done one after the other with no thermal step in between.

COMPARISON OF INVENTION TO OTHER PROCESSES BIPOLAR PROCESSES

The isolated vertical PNP transistor (VPNP) is the structure that allows the integration of complementary bipolar and CMOS on the same chip of silicon. This element is not available in other existing BiCMOS processes. However, a different version of it is available in pure complementary bipolar processes. However, the structure in the new scheme is vastly superior in the following aspects:

A. Much smaller size;
B. Simpler process with higher yield and reliability; and
C. Better and easier device optimization.

The principal differences in the process technology for the formation of VPNP in the present invention and these prior art complementary bipolar processes are as follows:

Present Invention: The P+ collector is formed by a high energy implant of doubly ionized boron atoms followed by minimum temperature steps. This leads to a buried P+ collector profile with the peak at a depth of 0–6 to 0.8 um and a very low concentration near the surface. There is very little lateral diffusion.

This, combined with a shallow implanted P+ emitter formed by a $BF_2$ implant, gives a compact high performance VPNP whose fT of >2 GHz is higher by a factor of 3 over the 700 MHz reported in Ref. IV (see Background Section), and a factor of 7 over the 300 MHz of Ref. III. The size is only ¼ their size.

Prior Art: The VPNP in the complementary bipolar processes, on the other hand, is formed through a buried P+ collector through a P+ implant before epitaxy. This leads to larger size and process complications through auto doping due to the presence of both N+ and P+ buried layers.

To start with, we compare the final impurity profiles in our process (simulated and verified by spreading resistance profiles with the one reported by T. Kikkawa, et al. (Ref. II).

The impurity profiles of the VPNP in the current complementary bipolar (CB) (Ref. II) and the one in the new complementary BiCMOS (CBiCMOS) of the present invention are sketched to the same scale in FIGS. 10A and 10B, respectively. While the peak impurity concentrations in the emitter, base and collector are approximately the same, the junction depths are smaller by an approximate factor of 7 for the present invention. This is also reflected in Table 1 below.

TABLE 1

| | Comparison of Peak Impurity Concentrations and Junction Depths in the New CBiCMOS Pure CB Processes | | | |
|---|---|---|---|---|
| | Junction Depths (um) | | Peak Impurity Concen. ($cm^3$) | |
| Region | New CBiCMOS um | CB um | New CBiCMOS $cm^3$ | CB $cm^3$ |
| P+ Emitter | 0.2 | 2.0 | $10^{20}$ | $7 \times 10^{18}$ |
| N Base | 0.4 | 3.0 | $3 \times 10^{17}$ | $3 \times 10^{17}$ |
| P Collector | 1.2 | 22.5 | $3 \times 10^{18}$ | $3 \times 10^{18}$ |
| N-Well (for Isolarion from P sub) | 4.0 | 28.5 | $1.5 \times 10^{16}$ | $1.5 \times 10^{16}$ |

The small junction depths for the present invention result in smaller lateral spreads and therefore smaller device sizes. In addition, the parasitic capacitances are smaller. The small emitter junction depth gives a flat current gain down to 100pA of collector current and the small base width gives a much higher fT. At Ic=-1mA, the measured fT is greater than 2 GHz.

Figure 10A:
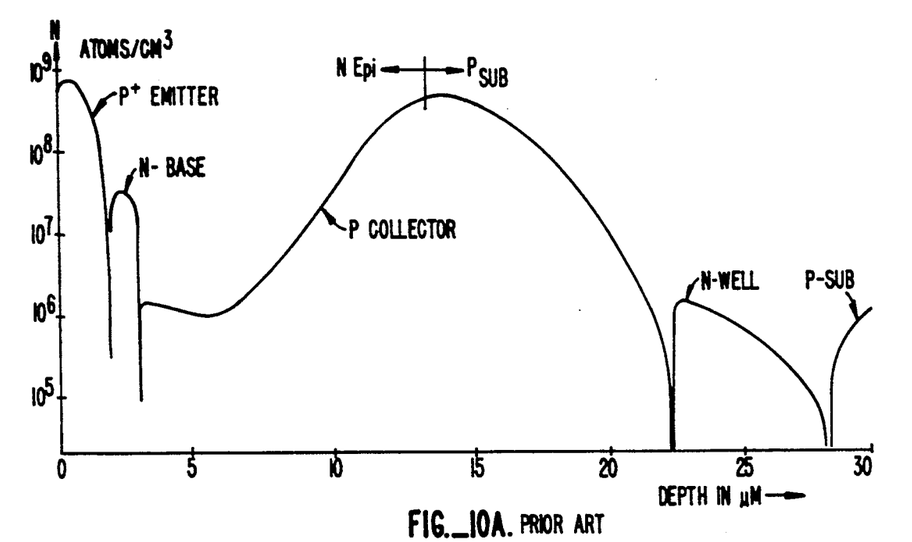
FIG. 10A is an impurity profile of a current complementary bipolar process as set forth in Ref. II.
Figure 10B:
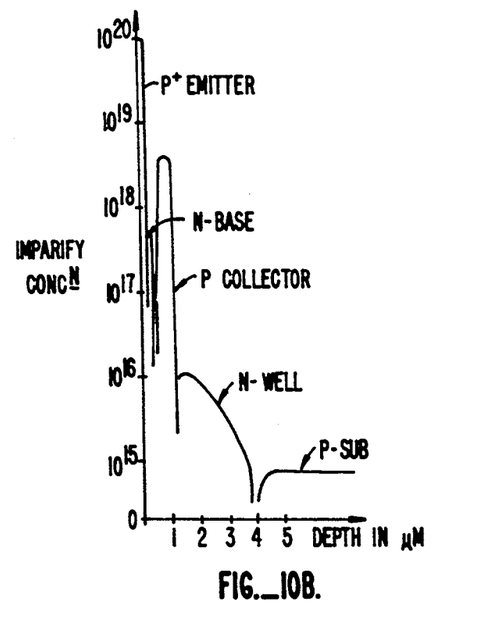
FIG. 10B is an impurity profile for the complementary BiCMOS process of the present invention shown to the same scale as FIG. 10A.
Figure 11A:
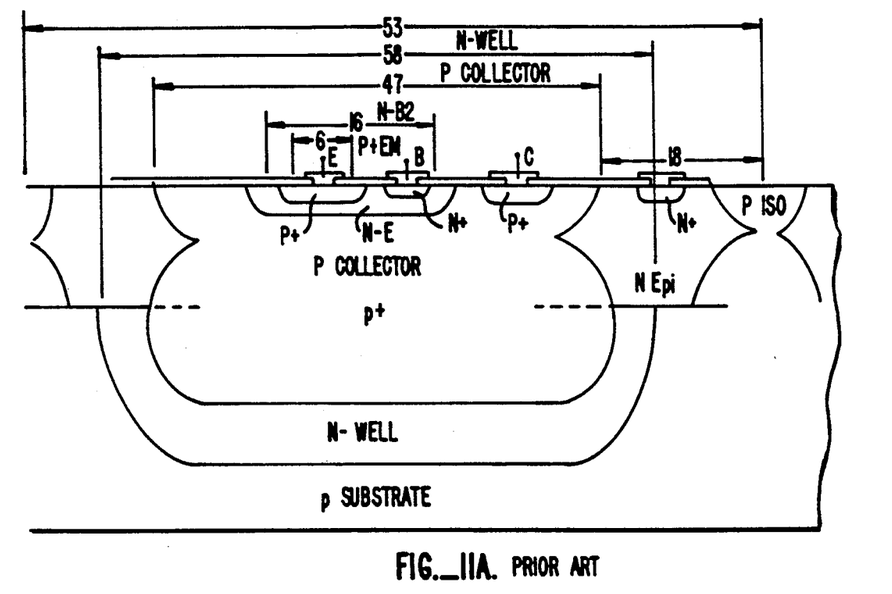
FIG. 11A is a cross-sectional view of a complementary vertical PNP transistor according to the prior art.
Figure 11B:
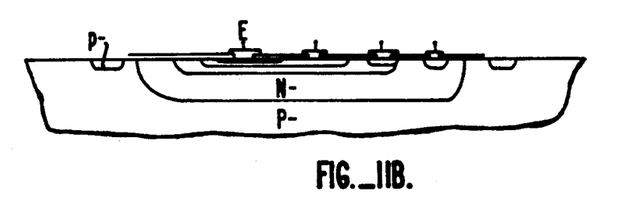
FIG. 11B is a cross-sectional view of a vertical PNP transistor according to the present invention drawn to the same scale as FIG. 11A.

The device cross-sections of the VPNP in the conventional complementary bipolar (CB) process and the new CBiCMOS process of the present invention are shown in FIGS. 11A and 11B, respectively. They are drawn on approximately the same scale and assume the same lithography tolerances and depletion widths. For the same P+ emitter width of 6 um, the VPNP in the new scheme is smaller by a factor of two per side and therefore occupies only a quarter of the area required for the VPNP in the CB process. This is again due to the much shallower junction depths for the new scheme as illustrated in FIGS. 10A and 10B.

Comparison of Process Complexity

In the new Complementary BiCMOS scheme of present invention, the P collector is formed by a high energy boron implant just prior to the P+ emitter impact. It does not need any extra thermal or process steps besides the usual CMOS flow after the P+ S/D implant. The P+ collector is isolated from the P substrate by the N-Well as in the conventional CMOS process.

The P collector in the CB processes is formed, on other hand, bY introducing a P+ buried layer, which in turn is isolated from the P— substrate by a very deep N-Well (junction depth of approx. 30 um from the top surface and approx. 16 um from the epi/substrate interface). Besides the increase in size, the deep buried P+ collector causes two significant process problems:

(1) Auto Doping during Epitaxy

The vertical NPN transistor needs an Arsenic or Antimony doped N+ buried layer to reduce its collector. Now, in addition, the CB process also has a heavily doped P+ buried layer.

During epitaxy, the dopant atoms in the buried layers come out and alter the desired epi doping by getting incorporated. This is known as autodoping and in extreme cases can change N type epi into P type or vice versa. While the autodoping of N type impurity species such as Arsenic can virtually be eliminated by going to reduced pressure epitaxial reactors, autodoping due to Boron has no such cure. This poses a serious restriction on the minimum doping of the N epi and compromises the breakdown voltages and parasitic capacitances of both NPN and PNP transistors.

(2) High Temperature N-Well Drive

The isolation N-Well must be driven to a very large junction depth (approx. 15 um). This entails a long, high temperature drive which is incompatible with modern IC processes. Such a drive will cause pattern distortion due to wafer warpage and limit the use of fine line lithography.

The N-Well also increases the P+ buried layer sheet resistance due to counter doping. It must also be pointed out that the structure outlined by Analog Devices (Ref. IV) uses a different process variant. The conventional CB processes start with P type substrate, N type Epi and P-wells for top and bottom isolation. In the process described in IV these are reversed, i.e., the starting material is N-substrate followed by P-Epi and N-Wells for top and bottom isolation. The vertical NPN transistor is the analog of the VPNP in the conventional CB process. Its N+ buried layer is isolated from the N substrate by a deep P-Well.

The cross-section of the vertical NPN is very similar to the one sketched in FIG. 11A, with the N type and P types interchanged.

Therefore, the prior art process suffers from the same disadvantages common to other CB processes, i.e. large size due to deep junctions, simultaneous P+ and N+ buried layers and a very deep P-Well for isolation.

SUMMARY OF ADVANTAGES OF THE PRESENT INVENTION

1. Shallower junctions and profiles which result in:
   (a) Smaller size (one quarter the area of conventional CB process);
   (b) Higher fT's (greater by a factor of at least 3); and
   (c) Smaller capacitances.
2. Simpler epitaxy with higher yield because there is no Boron doped P+ buried layer. CB processes need both N+ and P+ buried layers.
3. No deep isolation well. A regular CMOS N-Well is sufficient. Therefore, it is a modern fine feature IC process which minimizes high temperature steps.
4. Has same process flow as CMOS, therefore complementary bipolar and complementary any MOS transistors can be combined on the same chip.
5. Optimization of NPN's, PNP's and MOS transistors are independent and gives a flexible, high yield IC process.

Simulations have shown that the device of the present invention will have the following characteristics: $H_{FE} = 50$ to 100, BVCEO (Vpt) $> 10$ V, BVCBO $> 10$ V and fT $= 1$ to 2 GHz.

Adding N+ Buried Layers.

The device described so far has been implemented in a conventional CMOS process. In a BiCMOS process, to improve the drive capabilities of the vertical NPN, the collector series resistance must be reduced. This is done by incorporating an N+ buried layer 58 (see FIG. 1) in the front end.

The starting material is a P type substrate 4 instead of a P+ substrate. The additional steps are listed below:

| Starting Material: P-sub <100> | |
| --- | --- |
| N+ | Buried Layer Mask |
| N+ | Buried Layer Implant Arsenic/Antimony |
| N+ | Buried Layer Drive |
| P | Type Epitaxial Layer 60 |
| N | Well Mask |

The rest of the steps are the same as in the Appendix. The N+ Buried Layer and N-Well form an isolating structure in the P Epi or P substrate. There is one extra mask in the above scheme, i.e. the N+ Buried Layer mask.

As will be understood by those familiar with the art, the present invention may be embodied in other specific forms without departing from the spirit or central characteristics thereof. For example, the PNP transistors' emitter need not be formed to the same step as the P+ source and drain implantations for the P channel MOS device. Accordingly, the disclosure of the preferred embodiments of the invention is intended to be illustrative, but not limiting, of the scope of the invention which is set forth in the following claims.

| APPENDIX Complementary Bipolar & CMOS Process Sequence | |
| --- | --- |
| P-Epi on P+ Sub/PSub (starting Material) | |
| M#1 | N-Well Mask |
| | N-Well Implant P³¹ |
| | N-Well Drive |
| | Nitride Deposit |

-continued
APPENDIX
Complementary Bipolar & CMOS
Process Sequence

| | |
|---|---|
| M#2 | Active Mask |
| | Nitride Etch |
| M#3 | N Field Implant Mask |
| | N Field Implant $B^{11}$ |
| | Optional: P Field Mask |
| | PreGate Ox. P Field Implant $P^{31}$ |
| (New) | |
| M#4 | N-Base Mask |
| | N-Base Implant $P^{31}$ |
| | Gate Ox. |
| | $V_T$ Implant $B^{11}$ |
| M#5 | PMOS $V_T$ Implant Mask (Optional) |
| | PMOS $V_T$ Implant $B^{11}$ |
| (New) | |
| M#6 | P-Base Implant Mask |
| | P-Base Implant $B^{11}$ |
| | Poly 1 Deposit & Dope |
| | Poly 1 Interpoly Ox. |
| | Interpoly Nitride Deposit |
| M#7 | Poly 1 Mask |
| | Plasma Nitride/oxide/Poly 1 Stack Etch |
| | Poly 1 Edge Ox. |
| | Poly 2 Deposit & Dope |
| M#8 | Poly 2 Mask |
| | Poly 2 Etch |
| | Pre S/D Implant Ox. |
| M#9 | N+ S/D & N+ Em-Implant Mask |
| | N+ Implant $As^{75}$ |
| | High Volt. Implant $P^{31}$ |
| | Poly 2 Ox. |
| (New) | |
| M#10 | P+ Collector Mask |
| | P+ Collector Implant $B^{11}$ (Doubly ionized) |
| | (This step could be combined with M#6) |
| M#11 | P+ S/D & P+ Em Mask |
| | P+ S/D Implant $BF_2$ (or Low Energy $B^{11}$) |
| | BPSG Deposit |
| | BPSG Density |
| M#12 | Contact Mask |
| | Plasma Contact Etch |
| | BPSG Reflow |
| | Metal Sputter |
| M#13 | Metal Mask |
| | Plasma Metal Etch |
| | Passivation Oxy - Nitride Deposit |
| M#14 | Pad Mask |
| | Plasma Pad Etch |
| | Alloy |

What is claimed is:

1. In a method for forming CMOS transistors and NPN transistors on a single wafer, said method including the step of forming an N well as the collector of an NPN vertical transistor, an improvement for forming at least one isolated, vertical PNP transistor comprising the steps of:

forming an N-well to contain said PNP transistor during said step of forming an NPN vertical transistor collector;
implanting N type material to form an N base of said PNP transistor;
implanting a P type material at an energy greater than 300 keV for singly ionized material or greater than 150 kV for doubly ionized material to form a collector of said PNP transistor; and
forming a P region as an emitter of said PNP transistor.

2. The method of claim 1 wherein said N base is implanted at a dosage of between $3 \times 10^{13}$ and $1.5 \times 10^{14}/cm^2$.

3. The method of claim 2 wherein said N type material for said N base is phosphorus.

4. The method of claim 1 wherein said N base is formed before said collector.

5. The method of claim 1 wherein said emitter is a shallow P+ region less than 0.35 um thick.

6. The method of claim 1 wherein said doubly ionized material is Boron.

7. The method of claim 1 wherein said PNP emitter is formed in the same step as a formation of a P+ source and drain for said CMOS transistors.

8. The method of claim 1 wherein said PNP collector is formed in the same step as the P base of said NPN transistors.

9. In a method for forming CMOS transistors and NPN transistors on a single wafer, said method including the step of forming an N-well as the collector of an NPN vertical transistor, an improvement for forming at least one isolated, vertical PNP transistor comprising the steps of:

forming an N-well to contain said PNP transistor during said step of forming an NPN vertical transistor collector;
implanting phosphorus at a dosage of between $3 \times 10^{13}$ and $1.5 \times 10^{14}/cm^2$ to form an N base of said PNP transistor;
implanting, after said N base implantation, doubly ionized Boron, at an energy of at least 300 KeV to form a collector of said PNP transistor; and
forming a P+ region as an emitter of said PNP transistor simultaneously with forming P+ source and drain regions for said CMOS transistors.

10. The method of claim 9 further comprising the steps of:

implanting an N+ buried layer below said N-wells; and
growing a P type epitaxial layer.

* * * * *